United States Patent
Katayama

(10) Patent No.: US 11,582,850 B2
(45) Date of Patent: Feb. 14, 2023

(54) FAULT DIAGNOSIS DEVICE FOR ROBOT AND ROBOT SYSTEM

(71) Applicant: DENSO WAVE INCORPORATED, Chita-gun (JP)

(72) Inventor: Syu Katayama, Chita-gun (JP)

(73) Assignee: DENSO WAVE INCORPORATED, Aichi-pref. (JP)

( * ) Notice: Subject to any disclaimer, the term of this patent is extended or adjusted under 35 U.S.C. 154(b) by 2 days.

(21) Appl. No.: 17/025,121

(22) Filed: Sep. 18, 2020

(65) Prior Publication Data
US 2021/0084728 A1    Mar. 18, 2021

(30) Foreign Application Priority Data
Sep. 18, 2019   (JP) .............................. JP2019-169356

(51) Int. Cl.
*H05B 45/54* (2020.01)
*B25J 9/16* (2006.01)
*G01R 31/26* (2020.01)
*H05B 45/10* (2020.01)
*H05B 47/115* (2020.01)
*H05B 45/52* (2020.01)

(52) U.S. Cl.
CPC ............ *H05B 45/54* (2020.01); *B25J 9/1674* (2013.01); *G01R 31/2635* (2013.01)

(58) Field of Classification Search
CPC ........ H05B 45/00; H05B 45/10; H05B 45/30; H05B 47/10; H05B 47/115; H05B 47/165; H05B 45/52; H05B 45/54
See application file for complete search history.

(56) References Cited

U.S. PATENT DOCUMENTS

2005/0111231 A1* 5/2005 Crodian .............. H05B 47/155
                                                         362/545
2010/0097817 A1* 4/2010 Nagara ................ H05B 47/175
                                                         362/464
(Continued)

FOREIGN PATENT DOCUMENTS

JP     2016-043438 A    4/2016

OTHER PUBLICATIONS

Author: Shibagaki Ryunosuke, Title:: Laser Oscillation Device for Direct-Diode Laser Method and Failure Diagnosis Method for Laser Oscillation Device, Date: Apr. 15, 2019, p. 1-27 (Year: 2019).*
(Continued)

*Primary Examiner* — Wei (Victor) Y Chan
(74) *Attorney, Agent, or Firm* — Oliff PLC

(57) ABSTRACT

A fault diagnosis device is configured to diagnose a fault in a light emitting unit that emits light of a color according to an operating state of a robot by individually energizing and lighting a plurality of types of LEDs of different emission colors. The fault diagnosis device includes an energization control unit that controls energization of the LEDs, a voltage detection unit that detects a diagnostic voltage that varies depending on a terminal voltage of the LEDs, and a fault detection unit that detects a fault in the light emitting unit based on a control state of energization by the energization control unit and a detected value of the diagnostic voltage by the voltage detection unit.

16 Claims, 8 Drawing Sheets

(56) References Cited

U.S. PATENT DOCUMENTS

| | | | |
|---|---|---|---|
| 2011/0254554 A1* | 10/2011 | Harbers ................ | G01K 11/00 |
| | | | 702/57 |
| 2021/0044081 A1* | 2/2021 | Shibagaki .............. | B23K 26/21 |
| 2021/0163028 A1* | 6/2021 | Staude ................... | B60K 35/00 |

OTHER PUBLICATIONS

Author: Shibagaki Ryunosuke, Title:: Laser Oscillation Device for Direct-Diode Laser Method and Failure Diagnosis Method for Laser Oscillation Device, Date: Apr. 15, 2019, p. 1-10 (Translation) (Year: 2019).*

* cited by examiner

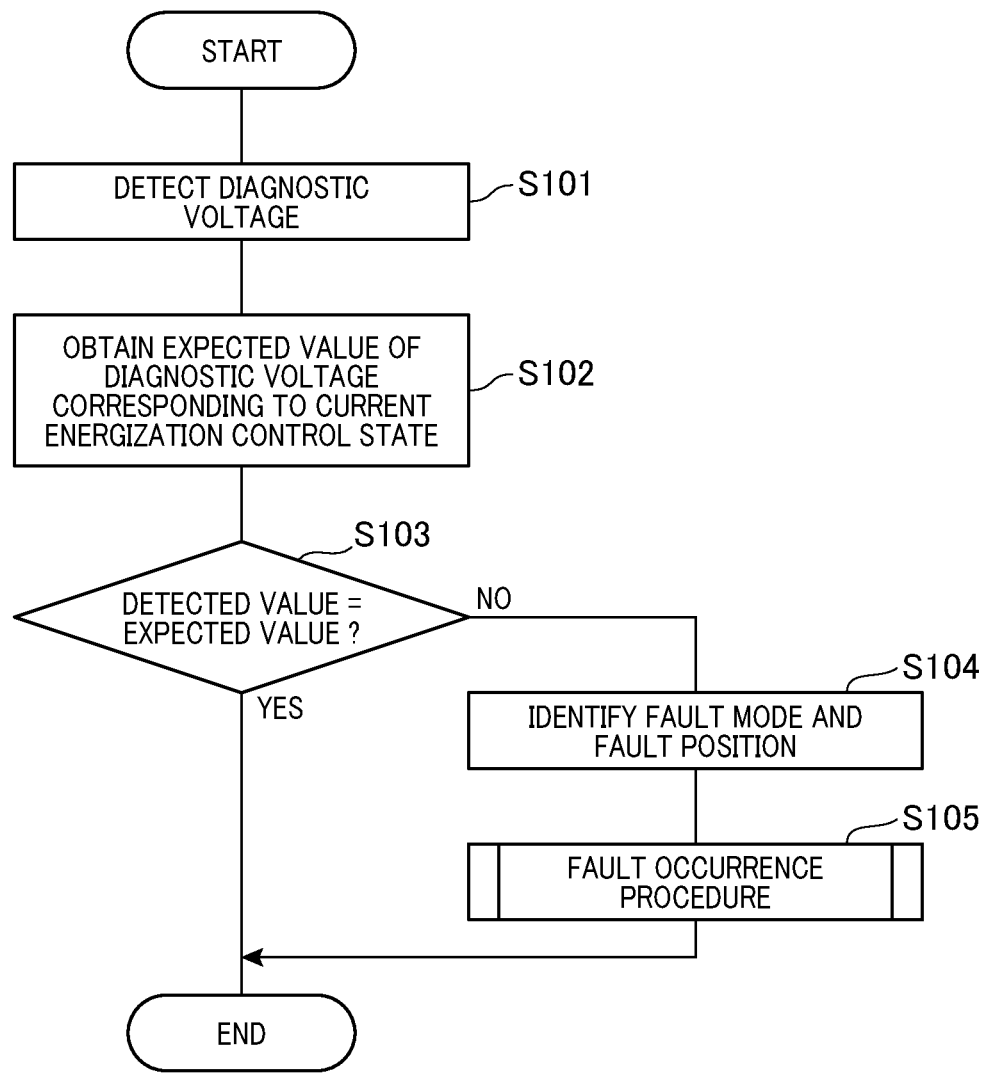

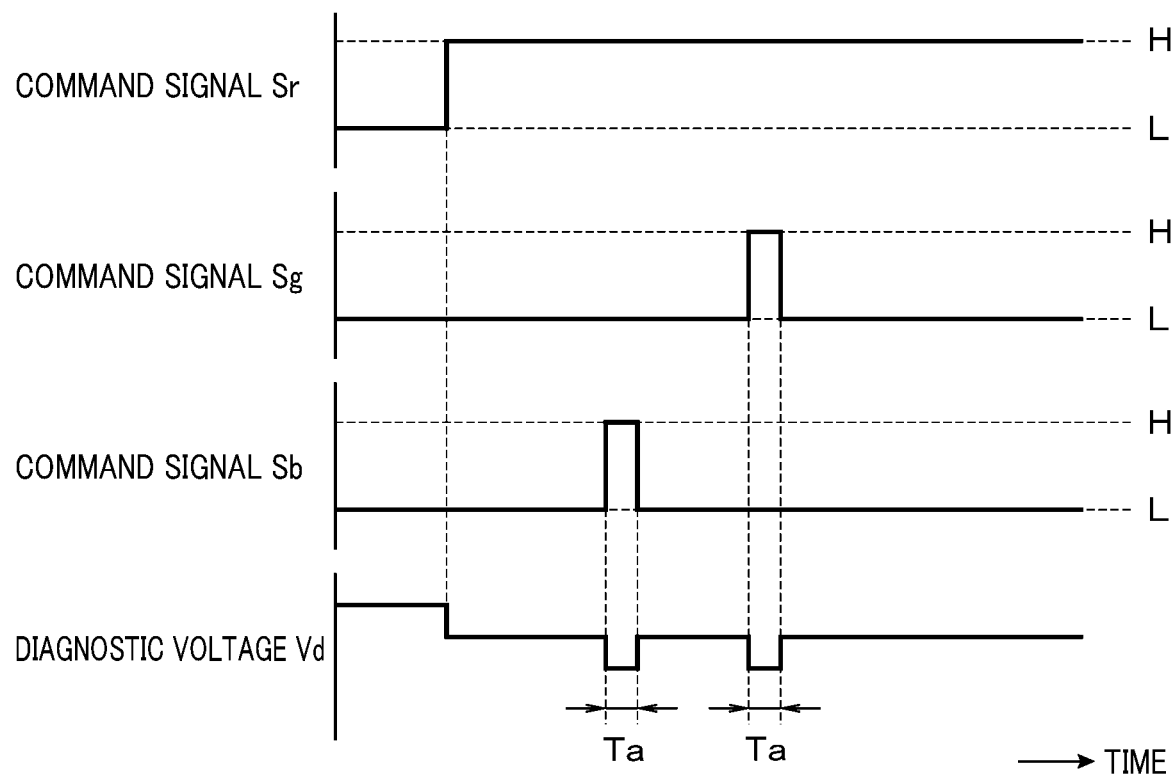

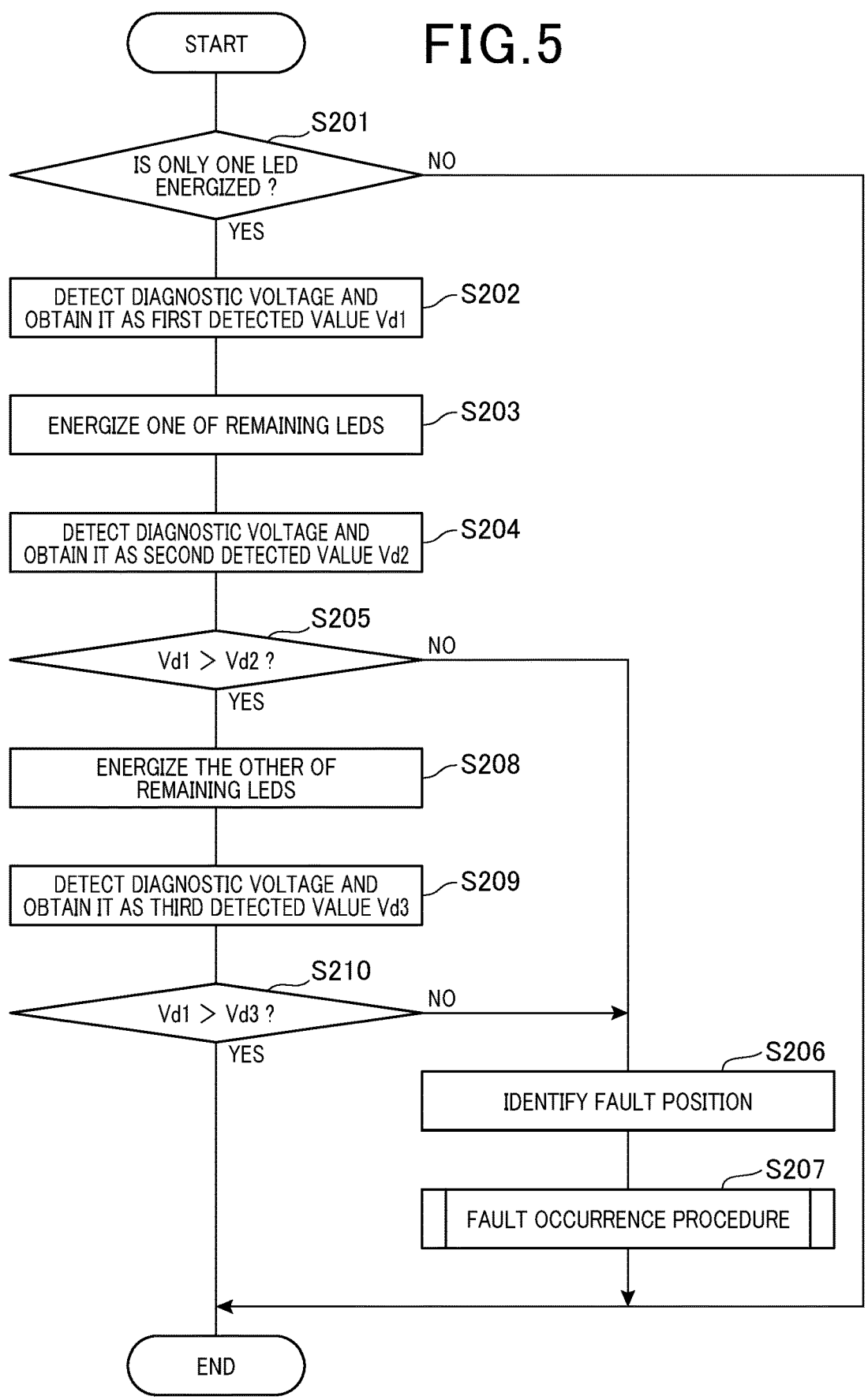

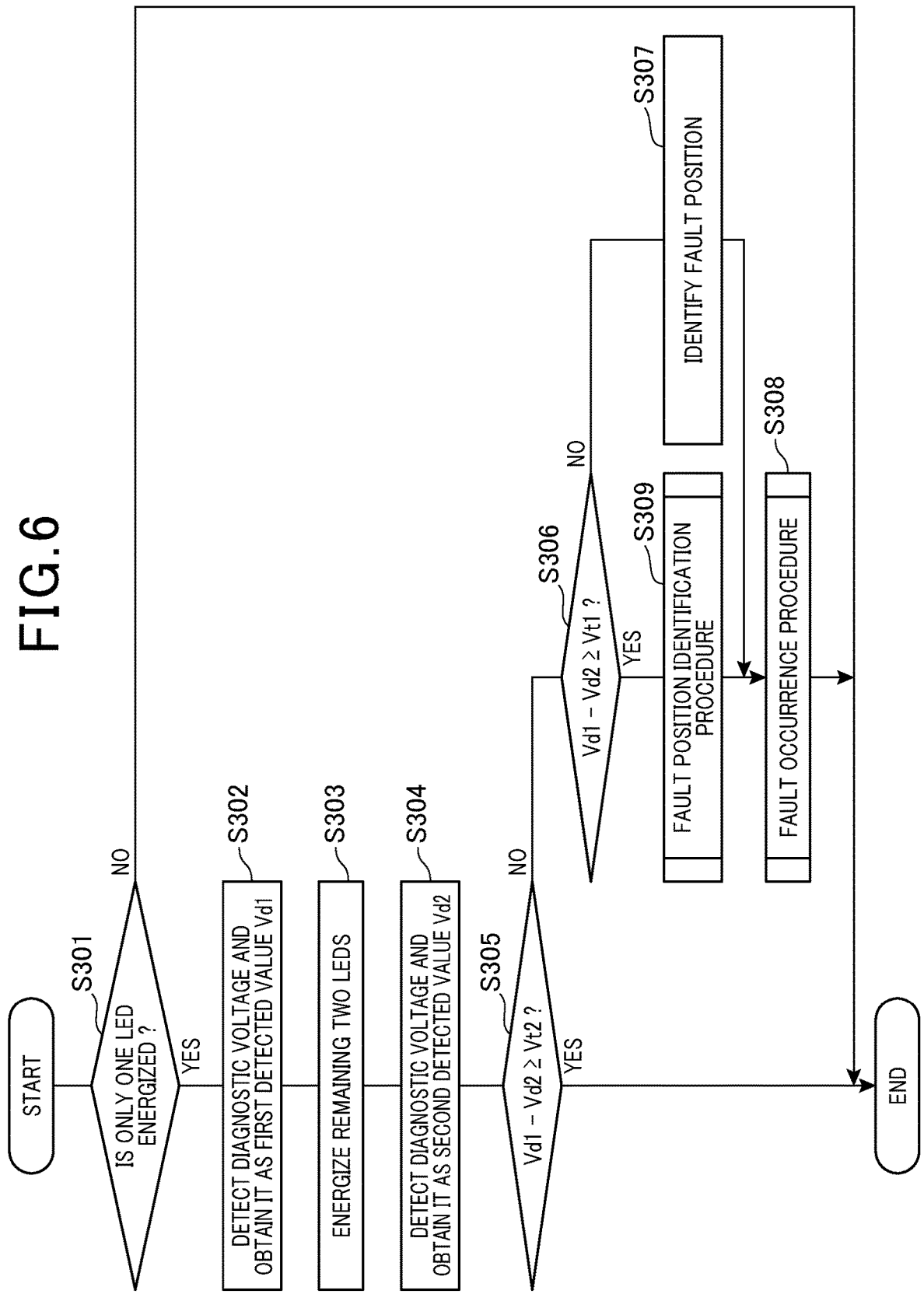

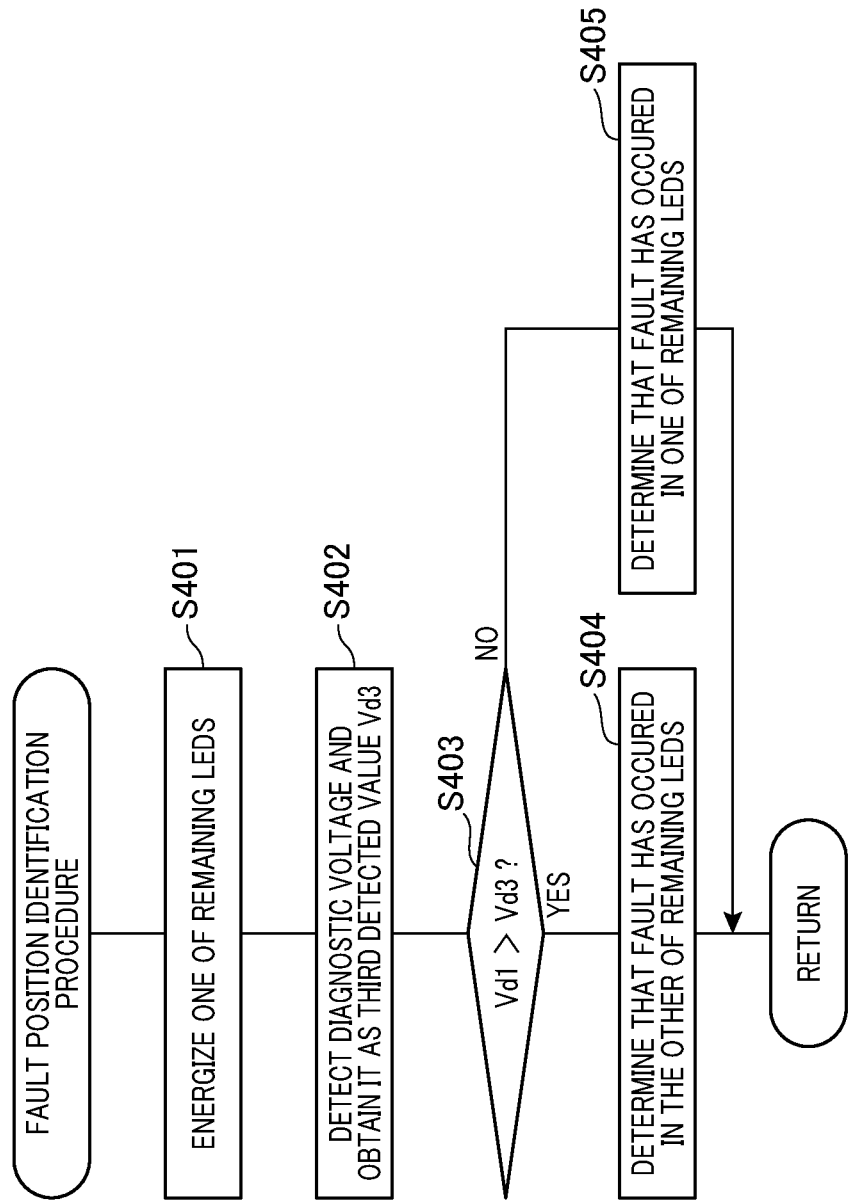

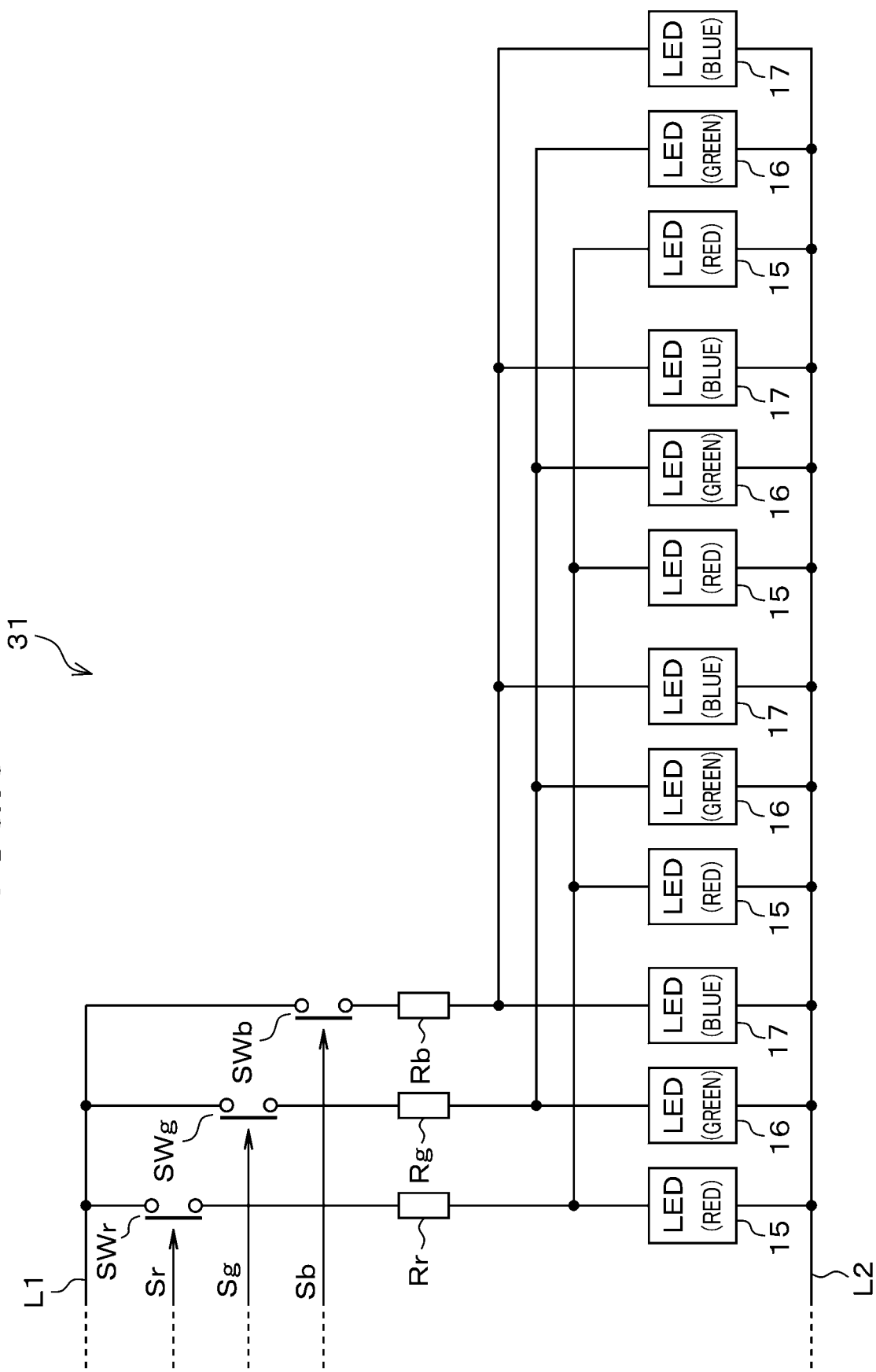

FAULT DIAGNOSIS DEVICE FOR ROBOT AND ROBOT SYSTEM

CROSS-REFERENCE TO RELATED APPLICATION

This application is based on and claims the benefit of priorities from earlier Japanese Patent Applications No. 2019-169356 filed Sep. 18, 2019, the description of which is incorporated herein by reference.

BACKGROUND

Technical Field

The present invention relates to a robot fault diagnosis device and a robot system, and in particular, a robot fault diagnosis device preferably applied to an industrial robot, which is able to diagnose a fault in a light emitting unit that emits light of a color according to a state of the robot, and a robot system provided with such a fault diagnosis device.

Related Art

As disclosed in JP 2016-43438 A, there have been robots having a light emitting unit that emits light of a color according to an operating state or the like. According to such a configuration, an operator can recognize the operating state or the like of the robot based on the color of light emitted from the light emitting unit. Such a light emitting unit includes three light emitting diodes corresponding to the three primary colors of light, that is, red, green, and blue. Each of these light emitting diodes can be individually energized to emit light of a color according to the state of the robot. In this specification, a light emitting diode may also be referred to as an LED.

PRIOR ART REFERENCE

Patent Document

[PTL 1] JP 2016-43438 A

In the above configuration, when a fault occurs in the LEDs constituting the light emitting unit or components for driving these LEDs, the light emitting unit may emit light of a color different from the color corresponding to the state of the robot. This may impair the safety of the operator using the robot to perform a predetermined operation. For example, when the color of light emitted from the light emitting unit is a color indicative of a direct teaching mode although the state of the robot is an automatic mode, the problem described below occurs. The automatic mode refers to a state in which the robot automatically performs a predetermined operation according to a preset program, whereas the direct teaching mode refers to a state in which the operator performs teaching by manually moving the robot arm.

That is, the operator erroneously recognizes that the robot is in the direct teaching mode based on the color of light emitted from the light emitting unit when it is a color indicative of the direct teaching mode. Accordingly, the operator approaches the robot trying to touch the arm for performing teaching. In this case, however, since the robot is in a state of automatically performing a predetermined operation, there is a risk that the arm may come into contact with the operator approaching the robot.

SUMMARY

It is thus desired to provide a fault diagnosis device for a robot (such as an industrial robot) and a robot system, which are capable of accurately detecting a fault in the light emitting unit that indicates the operating state of the robot.

A fault diagnosis device for a robot (such as an industrial robot) recited in a first exemplary embodiment is a device for diagnosing a fault in a light emitting unit that emits light of a color according to an operating state of the robot by individually energizing and lighting a plurality of types of light emitting diodes of different emission colors. The fault diagnosis device includes an energization control unit that controls energization of the light emitting diodes; a voltage detection unit that detects a diagnostic voltage that varies depending on a terminal voltage of the light emitting diodes; and a fault detection unit.

The terminal voltage of each light emitting diode varies depending on the energization state of the corresponding light emitting diode. Accordingly, the above diagnostic voltage varies depending on the energization state of each of the plurality of light emitting diodes. That is, in the above configuration, the diagnostic voltage assumes a unique voltage value for each energization state of the plurality of light emitting diodes. Further, in the above configuration, at the normal time when no fault occurs in the light emitting diodes and components for driving the light emitting diodes, each energization state of the plurality of light emitting diodes matches the control state of energization by the energization control unit, whereas, at the abnormal time when a fault occurs in either the light emitting diodes or components for driving the light emitting diodes, each energization state of the plurality of light emitting diodes does not match the control state of energization by the energization control unit.

For this reason, in the above configuration, the diagnostic voltage at the normal time becomes a voltage value which is substantially the same as the voltage value corresponding to the energization state of each of the plurality of light emitting diodes that can be estimated from the control state of energization by the energization control unit, whereas the diagnostic voltage at the abnormal time becomes a voltage value which is different from the voltage value corresponding to the energization state described above. In consideration of the above points, the fault detection unit detects a fault in the light emitting unit based on the control state of energization by the energization control unit and the detected value of the diagnostic voltage by the voltage detection unit. With this configuration, a fault in the light emitting unit can be accurately detected.

In general, the terminal voltage of the light emitting diode becomes substantially zero when the light emitting diode is not energized, whereas, the terminal voltage becomes a voltage value corresponding to the forward voltage when the light emitting diode is energized. Further, the forward voltage of the light emitting diode has a different voltage value for each emission color. Accordingly, taking into account such a difference in forward voltage, the fault detection unit having the above configuration can identify which of the plurality of types of light emitting diodes and the components for driving the light emitting diodes has a fault.

In the configuration recited in the first exemplary embodiment, a method can be adopted for diagnosing a fault in the light emitting unit, which is performed by energizing (lighting) one of the light emitting diodes in the state in which all the light emitting diodes have been deenergized (not lighted). In this method, however, the light emitting unit, which has not emitted light, suddenly emits light of a color that does not correspond to the operating state of the robot. In this case, since the light emitting unit makes a transition from a non-light emission state to a light emission state, such a change is immediately noticeable for the user (operator) who uses the robot. As a consequence, the operator, who notices that the light emitting unit has suddenly emitted light at a timing that they did not expect, may feel uneasy.

In the fault diagnosis device for a robot recited in a second exemplary embodiment, in a period during which the operating state of the robot is such that only one of the light emitting diodes in the light emitting unit is energized, the energization control unit is configured to energize one of the remaining light emitting diodes. Further, the fault detection unit recited in the second exemplary embodiment is configured to detect a fault in the light emitting unit based on a detected value of the diagnostic voltage detected in the period during which the energization control unit energizes one of the remaining light emitting diodes as described above.

With this configuration, the light emitting unit does not make a sudden transition from a non-light emission state to a light emission state. In this case, the color of light emitted from the light emitting unit changes from a color of light emitted from one light emitting diode that has been initially energized to a mixed color obtained by mixing the color of light initially emitted with a color of light emitted from the one of the remaining light emitting diodes. Such a change is less noticeable for the operator. Therefore, according to the above configuration, a diagnosis of the light emitting unit can be performed without making the operator feel uneasy.

In the fault diagnosis device recited in a third exemplary embodiment, in a period during which the operating state of the robot is such that only one of the light emitting diodes in the light emitting unit is energized, the energization control unit is configured to energize a plurality of the remaining light emitting diodes. Further, the fault detection unit recited in the third exemplary embodiment is configured to detect a fault in the light emitting unit based on a detected value of the diagnostic voltage detected in the period during which the energization control unit energizes a plurality of the remaining light emitting diodes as described above.

With this configuration, the light emitting unit does not make a sudden transition from a non-light emission state to a light emission state. In this case, the color of light emitted from the light emitting unit changes from a color of light emitted from one light emitting diode that has been initially energized to a mixed color obtained by mixing the color of light initially emitted with a color of light emitted from the plurality of the remaining light emitting diodes. Such a change is less noticeable for the operator. Therefore, according to the above configuration, a diagnosis of the light emitting unit can be performed without making the operator feel uneasy.

In the fault diagnosis device for a robot recited in a further exemplary embodiment, the light emitting unit including a red light emitting diode, a green light emitting diode, and a blue light emitting diode, which are three light emitting diodes corresponding to three primary colors of light, is a target of diagnosis. The light emitting unit emits white light due to the red light emitting diode, the green light emitting diode, and the blue light emitting diode being energized when the state of the robot is a first state, in which a predetermined operation is automatically performed. The light emitting unit emits red light due to the red light emitting diode being energized when the state of the robot is a second state, in which an error with a relatively high degree of importance has occurred.

The light emitting unit emits yellow light due to the red light emitting diode and the green light emitting diode being energized when the operating state of the robot is a third state, in which an error with a relatively low degree of importance has occurred. The light emitting unit emits green light due to the green light emitting diode being energized when the state of the robot is a fourth state, which is an initialization state. The light emitting unit emits blue light due to the blue light emitting diode being energized when the state of the robot is a fifth state, which is a direct teaching mode in which a user who uses the robot performs teaching by manually moving the robot.

As the light emitting unit described above is a target of fault diagnosis, the following effects can be obtained. That is, the operating state of the robot in which only one of the light emitting diodes is energized corresponds to the second state, the fourth state, and the fifth state. With this configuration, even when one of the remaining light emitting diodes is energized for fault diagnosis in the above state, it is possible to eliminate a concern that the safety of the operator lowers. The reason for this will be described below.

First, when the blue light emitting diode is energized in the second state of the robot, the color of light emitted from the light emitting unit becomes magenta, which is a mixed color of red and blue, and does not become a color indicative of another state of the robot. Accordingly, the operator does not erroneously recognize the state of the robot, and thus does not carelessly approach the robot. This eliminates a concern that the safety of the operator lowers. Further, when the green light emitting diode is energized in the second state of the robot, the color of light emitted from the light emitting unit becomes yellow, which is a mixed color of red and green. In this case, yellow is a color corresponding to the third state, which indicates that the robot is in an error state, as with red, which is the color initially emitted. Therefore, even when the operator notices that the color of emitted light changes from red to yellow, the operator still recognizes that the robot is in an error state, and thus does not carelessly approach the robot. This prevents occurrence of a problem in safety.

Further, when the red light emitting diode is energized in the fourth state of the robot, the color of light emitted from the light emitting unit also becomes yellow, which is a mixed color of green and red. As described above, yellow is a color indicating that the robot is in an error state. Therefore, even when the operator notices that the color of emitted light changes from green to yellow, the operator recognizes that the state of the robot has changed from initialization to an error state, and thus does not carelessly approach the robot. This eliminates a concern that the safety of the operator lowers. Further, when the blue light emitting diode is energized in the fourth state of the robot, the color of light emitted from the light emitting unit becomes cyan, which is a mixed color of green and blue, and does not become a color indicative of another state of the robot. Accordingly, the operator does not erroneously recognize the state of the robot, and thus does not carelessly approach the robot. This prevents occurrence of a problem in safety.

Further, when the red light emitting diode is energized in the fifth state of the robot, the color of light emitted from the light emitting unit becomes magenta, which is a mixed color of blue and red, and does not become a color indicative of another state of the robot. Accordingly, the operator does not erroneously recognize the state of the robot, and thus does not carelessly approach the robot. This eliminates a concern that the safety of the operator lowers. Further, when the green light emitting diode is energized in the fifth state of the robot, the color of light emitted from the light emitting unit becomes cyan, which is a mixed color of blue and green, and does not become a color indicative of another state of the robot. Accordingly, the operator does not erroneously recognize the state of the robot, and thus does not carelessly approach the robot. This prevents occurrence of a problem in safety.

Further, according to this configuration, when remaining two light emitting diodes are energized for a fault diagnosis in the state in which only one of the light emitting diodes has been energized, or when remaining one light emitting diode is energized for a fault diagnosis in the state of the robot (third state) in which two of the light emitting diodes have been energized, it is possible to eliminate a concern that the safety of the operator lowers. In these cases, the color of light emitted from the light emitting unit becomes white, which is a color indicating that the robot is in the first state, in which the robot automatically performs a predetermined operation. Therefore, even when the operator notices that the color of emitted light changes from the initial color to white, the operator recognizes that the state of the robot has changed from the state indicated by the initial color to the first state, and thus does not carelessly approach the robot. This prevents occurrence of a problem in safety.

In the present disclosure, in order to obtain advantages similar to the advantages of the first exemplary embodiment, there is still provided a robot system, comprising: an industrial robot; a light emitting unit installed in the robot and configured to emit light of a color according to an operating state of the robot by individually energizing and lighting a plurality of types of light emitting diodes of different emission colors; an energization control unit configured to control energization of the light emitting diodes; a voltage detection unit configured to detect a diagnostic voltage that varies depending on a terminal voltage of the light emitting diodes; and a fault detection unit configured to detect a fault in the light emitting unit based on a control state of the energization by the energization control unit and a detected value of the diagnostic voltage detected by the voltage detection unit. This fault detection unit can be configured in the similar manner to that in the first exemplary embodiment.

BRIEF DESCRIPTION OF THE DRAWINGS

In the accompanying drawings:

FIG. 3 is a diagram schematically showing a flow of procedure in a first diagnostic method according to the first embodiment.

FIG. 4 is a timing chart schematically showing a signal in each unit when the robot according to the first embodiment is in a second state.

FIG. 5 is a diagram schematically showing a flow of procedure in a second diagnostic method according to the first embodiment.

FIG. 6 is a diagram schematically showing a flow of procedure in a third diagnostic method according to the first embodiment.

FIG. 7 is a diagram schematically showing a flow of fault position identification procedure according to the first embodiment.

FIG. 8 is a diagram schematically showing a configuration of a light emitting unit according to a second embodiment.

DETAILED DESCRIPTION OF THE PREFERRED EMBODIMENTS

Figure 1:
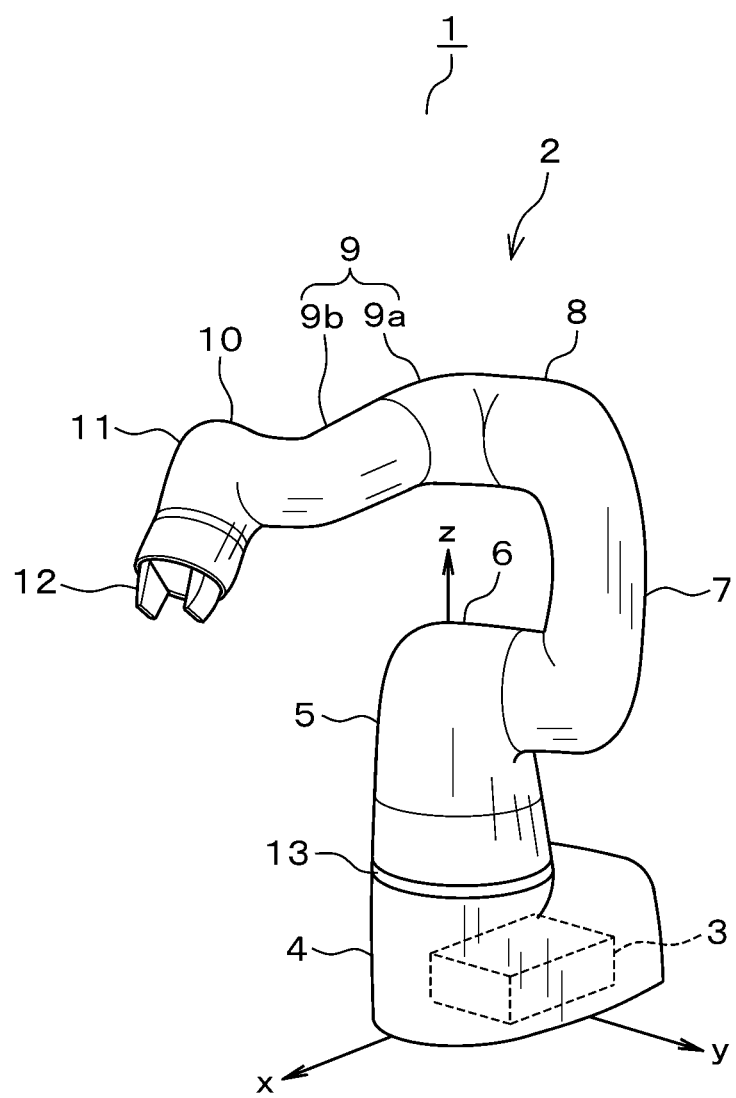
FIG. 1 is a schematic view of a configuration of a robot (industrial robot) system according to a first embodiment.

With reference to the drawings, a plurality of embodiments will be described. Throughout the embodiments, the same reference numerals refer to substantially the same components, and the description thereof will be omitted.

First Embodiment

With reference to FIGS. 1 to 7, a fault diagnosis device for an industrial robot (or simply a robot), which is according to a first embodiment will now be described.

As shown in FIG. 1, an industrial robot system 1 includes a vertically articulated robot 2 provided with a base 4 and an arm structure explained later, and a controller 3 housed in the base 4 for controlling motions (operating sates) of the robot 2. Although the controller 3 shown in FIG. 1 is illustrated as a rectangular box shape, the controller 3 actually has a shape corresponding to the shape of the base 4. The robot system 1 is used in general industrial applications. The robot 2 is a 6-axis vertically articulated robot. Of course, any other types of robots can be adopted in the present embodiment.

The arm structure is mounted on the base 4, as exemplified in FIG. 1. A shoulder 5 is horizontally rotatably connected to the base 4 via a first shaft having an axis in the Z direction. A lower end of a first arm 7, which extends upward, is vertically rotatably connected to the shoulder 5 via a second offset arm 6, which has a second shaft having an axis in the Y direction and extends in the Y direction. A second arm 9 is vertically rotatably connected to an upper end of the first arm 7 via a third offset arm 8, which has a third shaft having an axis in the Y direction and extends in the −Y direction. The second arm 9 includes a proximal portion 9a and a distal portion 9b.

The second arm 9 includes a fourth shaft having an axis in the X direction, and the distal portion 9b is twistably connected to the proximal portion 9a. A wrist 11 is vertically rotatably connected to a distal end of the second arm 9 via a fifth offset arm 10, which has a fifth shaft having an axis in the Y direction and extends in the −Y direction. A flange (not shown) and a hand 12 are twistably connected to the wrist 11 via a sixth shaft having an axis in the X direction. The respective shafts of the robot 2 are each provided with a corresponding motor (not shown) serving as a driving source.

The controller 3 is a controller for the robot 2, and configured to execute a computer program by control means functionally formed by a computer system including a CPU, a ROM, a RAM later described, and other necessary components (not shown) to thereby control the robot 2. Specifically, the controller 3 includes a driving unit having an inverter circuit and the like, and drives each motor, for example, by feedback control based on the rotation position of the motor detected by an encoder corresponding to the motor.

The controller 3 controls the robot 2 to automatically perform a predetermined operation by each arm of the robot 2 by executing a preset operation program. Hereinafter, such an operation mode is referred to as an automatic mode. Further, the controller 3 is capable of direct teaching by which the user teaches the position and posture of the distal portion of the arm of the robot 2 by manually moving the robot 2. Hereinafter, such an operation mode for performing direct teaching is referred to as a direct teaching mode.

Figure 2:
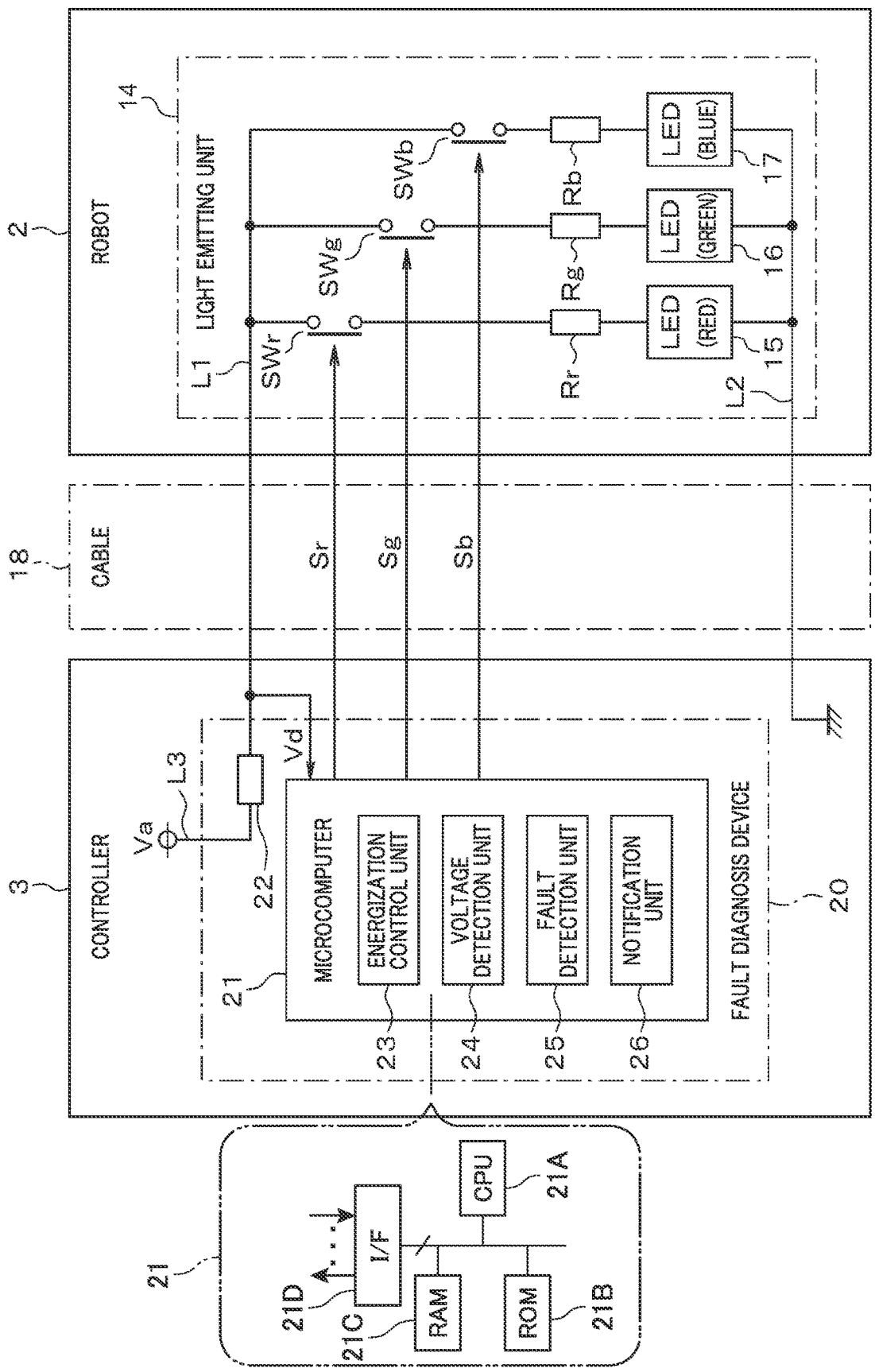
FIG. 2 is a schematic diagram of an electric configuration of a robot system according to the first embodiment.

A window 13 made of a transparent resin material and formed in an annular shape is provided at a cylindrical portion of the base 4 of the robot 2. Further, as shown in FIG. 2, the robot 2 includes a light emitting unit 14 that emits light of a color according to the operating state of the robot 2. Light emitted from the light emitting unit 14 is emitted outside via (passing through) the window 13. The light emitting unit 14 emits light of a color according to the operating state of the robot 2 by individually energizing and lighting a plurality of types of light emitting diodes of different emission colors.

In the present embodiment, the light emitting unit 14 includes a red light emitting diode 15, a green light emitting diode 16, and a blue light emitting diode 17, which are three light emitting diodes corresponding to the three primary colors of light. Hereinafter, the red light emitting diode 15, the green light emitting diode 16, and the blue light emitting diode 17 are referred to as R-LED 15, G-LED 16, and B-LED 17, respectively, or simply referred to as LED 15, LED 16, and LED 17, respectively. In this case, each of the LEDs 15 to 17 are arranged at distances therebetween sufficiently close to allow the light emitting unit 14 to emit a synthesized color obtained by synthesizing three primary colors of light.

The robot 2 described herein has a first state, a second state, a third state, a fourth state, and a fifth state (i.e., a first operating state, a second operating state, a third operating state, a fourth operating state, and a fifth operating state). The first state is a state in which the robot 2 automatically performs a predetermined operation, that is, a state in the automatic mode described above. The second state is a state in which an error with a relatively high degree of importance has occurred in the robot 2. The error with a relatively high degree of importance refers to an error with a high degree of urgency such as one causing operation failure of the robot 2 due to occurrence of abnormality in a power supply system.

The third state is a state in which an error with a relatively low degree of importance has occurred in the robot 3. The error with a relatively low degree of importance refers to an error with a low degree of urgency that can be recovered without shutting off the power, such as the case where the temperature of the robot 2 becomes higher than a specified value or where the programming has a problem. The fourth state is an initialization state. The initialization is performed when the robot system 1 is powered on, and during the initialization, the robot 2 cannot operate. The fifth state is a state in which the user (operator) who uses the robot can perform teaching by manually moving the robot 2, that is, in the direct teaching mode described above.

The light emitting unit 14 is configured to emit light of a predetermined color according to each of the above five operating states. That is, when the robot 2 is in the first state, the R-LED 15, the G-LED 16, and the B-LED 17 are energized and thus the light emitting unit 14 emits white light. When the robot 2 is in the second state, the R-LED 15 is energized and thus the light emitting unit 14 emits red light. When the robot 2 is in the third state, the R-LED 15 and G-LED 16 are energized and thus the light emitting unit 14 emits yellow light. When the robot 2 is in the fourth state, the G-LED 16 is energized and thus the light emitting unit 14 emits green light. When the robot 2 is in the fifth state, the B-LED 17 is energized and thus the light emitting unit 14 emits blue light.

The robot system 1 has a configuration for controlling light emission by the light emitting unit 14 and a configuration for detecting a fault in the light emitting unit 14. With reference to FIG. 2, these configurations will now be described. The light emitting unit 14 includes switches SWr, SWg, and SWb, and resistors Rr, Rg, and Rb in addition to the LEDs 15 to 17. The switches SWr, SWg, and SWb are configured with semiconductor switching elements such as MOSFET, and are controlled to be turned on and off by command signals Sr, Sg, and Sb, respectively, which are binary signals supplied from the controller 3 via a cable 18. Specifically, the switches SWr, SWg, and SWb are turned on when the command signals Sr, Sg, are Sb, respectively, are at high level, and turned off when they are at low level.

A first terminal of the switch SWr is connected to a power supply line L1, and a second terminal is connected to a ground line L2 via the resistor Rr and the R-LED 15. A first terminal of the switch Swg is connected to the power supply line L1, and a second terminal is connected to the ground line L2 via the resistor Rg and the G-LED 16. A first terminal of the switch Swb is connected to the power supply line L1, and a second terminal is connected to the ground line L2 via the resistor Rb and the B-LED 17.

The power supply line L1 and the ground line L2 are connected to the controller 3 via the cable 18, whereby a power supply voltage Va for driving the LEDs 15 to 17 is supplied from the controller 3 to the light emitting unit 14. In the above configuration, the switch SWr is turned on to energize and light the R-LED 15, the switch SWg is turned on to energize and light the G-LED 16, and the switch SWb is turned on to energize and light the B-LED 17. A current flowing during energization of the LEDs 15 to 17 are limited by the resistors Rr, Rg, and Rb. That is, the resistors Rr, Rg, and Rb function as current limiting resistors.

The controller 3 includes a fault diagnosis device 20 that controls light emission by the light emitting unit 14 and diagnoses a fault in the light emitting unit 14. The fault diagnosis device 20 includes a microcomputer 21 and a resistor 22. The resistor 22 is connected in series between the power supply line L3 to which the power supply voltage Va is supplied, and the power supply line L1 through which the power supply voltage Va is supplied to the light emitting unit 14. A voltage at the terminal of the resistor 22 connected to the power supply line L1 is supplied to the microcomputer 21 as a diagnostic voltage Vd for diagnosing a fault in the light emitting unit 14.

The microcomputer 21 includes functional blocks such as an energization control unit 23, a voltage detection unit 24, a fault detection unit 25, and a notification unit 26. These functional blocks are implemented by the CPU 21A included in the microcomputer 21 executing a computer program stored in a main memory such as the ROM 21B (serving as a non-transitory computer-readable recording medium) to perform the procedure corresponding to the computer program, that is, implemented by software. In the microcomputer 21, reference numerals 21C and 21D show a RAM and an interface (I/O) respectively. In addition, at least part of the function blocks may be functionally configured to be implemented by the hardware.

The energization control unit 23 controls energization of the LEDs 15 to 17 of the light emitting unit 14, and generates the command signals Sr, Sg, and Sb. The command signals Sr, Sg, and Sb generated by the energization control unit 23 are supplied to the light emitting unit 14 via the cable 18, and also supplied to the fault detection unit 25. The energization control unit 23 can also provide the command signals Sr, Sg, and Sb as PWM signals or pulse width modulation signals.

Accordingly, the energization control unit 23 can control the duty of the command signals Sr, Sg, and Sb to thereby control the brightness of light emission by the LEDs 15 to 17.

The voltage detection unit 24 detects a diagnostic voltage Vd, and supplies the detected value to the fault detection unit 25. The fault detection unit 25 recognizes the control state of energization of the LEDs 15 to 17 by the energization control unit 23 based on the command signals Sr, Sg, and Sb. The fault detection unit 25 detects a fault in the light emitting unit 14 based on the control state of energization by the energization control unit 23 and the detected value of the diagnostic voltage Vd as described below.

That is, the terminal voltages of the LEDs 15 to 17 vary depending on their energization states. Accordingly, the above diagnostic voltage Vd varies depending on the energization state of each of the plurality of LEDs 15 to 17. That is, in the above configuration, the diagnostic voltage Vd assumes a unique voltage value for the energization state of each of the plurality of LEDs 15 to 17. Specifically, the diagnostic voltage Vd assumes the voltage which is approximately at the same as the power supply voltage Va when all the LEDs 15 to 17 are not energized.

When only one LED among the LEDs 15 to 17 is energized, the diagnostic voltage Vd becomes a voltage lower than the power supply voltage Va by a predetermined value, which is determined by the terminal voltage (forward voltage) of the above one LED. Further, when only two LEDs among the LEDs 15 to 17 are energized, the diagnostic voltage Vd becomes a voltage lower than the power supply voltage Va by a predetermined value, which is determined by the terminal voltages of the above two LEDs.

Furthermore, when all the LEDs 15 to 17 are energized, the diagnostic voltage Vd becomes a voltage lower than the power supply voltage Va by a predetermined value, which is determined by the terminal voltages of the above all the LEDs 15 to 17. Thus, the diagnostic voltage Vd varies depending on the terminal voltages of the LEDs 15 to 17. In addition, the diagnostic voltage Vd is lower when only two LEDs are energized than when only one LED is energized, and is lower when all the LEDs are energized than when only two LEDs are energized.

In the above configuration, at the normal time when no fault occurs in the LEDs 15 to 17 and components for driving the LEDs 15 to 17 (the switches SWr, SWg, and SWb, the wiring interposed between the energization paths for the LEDs 15 to 17, and the like), each energization state of the LEDs 15 to 17 matches the control state of energization by the energization control unit 23, whereas, at the abnormal time when a fault occurs in at least one of them, each energization state of the LEDs 15 to 17 does not match the control state of energization by the energization control unit 23.

For this reason, in the above configuration, the diagnostic voltage Vd at the normal time becomes a voltage value which is substantially the same as the voltage value corresponding to the energization state of each of the plurality of the LEDs 15 to 17 that can be estimated from the control state of energization by the energization control unit 23 (hereinafter, referred to as an expected value), whereas the diagnostic voltage Vd at the abnormal time becomes a voltage value different from the expected value. In consideration of the above points, the fault detection unit 25 detects a fault in the light emitting unit 14 based on the control state of energization by the energization control unit 23 and the detected value of the diagnostic voltage Vd by the voltage detection unit 24.

The fault modes that the fault detection unit 25 can detect are as follows. In the following description, the LEDs 15 to 17 are collectively referred to as the LED, and the switches SWr, SWg, and SWb are collectively referred to as the switch.

(a) Open circuit fault of the LED
(b) Short circuit fault of the LED
(c) Wire break of the wiring interposed between the energization paths for the LED
(d) Open circuit fault of the switch
(e) Short circuit fault of the switch As described above, the fault modes of the light emitting unit 14 involves not only fault of the LEDs themselves, but also fault of components for driving the LEDs. Among the above fault modes, since (a), (c) and (d) are all fault modes in which the energization path for the LED is open, these fault modes are hereinafter simply referred to as an open circuit fault.

When an open circuit fault occurs, an energization path corresponding to a switch does not allow a current to flow therethrough, although the energization control unit 23 controls the switch to be turned on. Accordingly, the detected value of the diagnostic voltage Vd becomes higher than the expected value. When a short circuit fault occurs in the LED, the terminal voltage becomes almost 0 V without causing a voltage drop in the LED, although the energization control unit 23 controls the switch to be turned on. Accordingly, the detected value of the diagnostic voltage Vd becomes lower than the expected value.

Further, when a short circuit fault occurs in the switch, an energization path corresponding to the switch allows a current to flow therethrough, although the energization control unit 23 controls the switch to be turned off. Accordingly, the detected value of the diagnostic voltage Vd becomes lower than the expected value. The fault detection unit 25 can detect a fault in the light emitting unit 14 and identify the fault mode based on the relationship between the detected value and the expected value of the diagnostic voltage Vd described above.

When a fault in the light emitting unit 14 is detected by the fault detection unit 25, the notification unit 26 performs a notification procedure for notifying the operator (user) of occurrence of a fault in the light emitting unit 14 by a method other than lighting of the LEDs 15 to 17. Specific examples of the method for such notification include generating error sound, transmitting a command such as an error command, and shutting off the power supply to the robot 2 for emergency stop.

Next, methods for fault diagnosis by the fault diagnosis device 20 having the above configuration will be described below.

[1] First Diagnostic Method

A first diagnostic method is a method capable of diagnosing a fault in the light emitting unit 14 even when the robot 2 is in any of the first to fifth operating states. Further, the first diagnostic method is a method of diagnosing a fault in the light emitting unit 14 without changing the control of energization of the LEDs 15 to 17 by the light emitting unit 14 from the normal time. The fault diagnosis device 20 (practically, the CPU 21A) described herein is configured to repeatedly perform steps shown in FIG. 3 at a predetermined cycle.

First, in step S101, a diagnostic voltage Vd is detected. Subsequently, in step S102, an expected value of the diagnostic voltage Vd corresponding to the current control state of energization by the energization control unit 23 is obtained. Subsequently, in step S103, it is determined whether or not the detected value of the diagnostic voltage Vd obtained in step S101 matches the expected value of the diagnostic voltage Vd obtained in step S102. In order to ensure a desired accuracy in diagnosis taking into account various margins of error, the expected value may be set as a predetermined value range. In this case, in step S103, it is determined whether or not the detected value is within the predetermined value range of the expected value.

When the detected value matches the expected value, "YES" is determined in step S103 and this procedure ends. In this case, as a result of fault diagnosis by the fault diagnosis device 20, the result is obtained that a fault has not occurred in the light emitting unit 14. On the other hand, when the detected value does not match the expected value, "No" is determined in step S103, and the process proceeds to step S104. In step S104, the fault mode and the fault position are identified based on the relationship between the detected value and the expected value.

In the above configuration, when the detected value is higher than the expected value, it is possible to identify that an open circuit fault has occurred. In the above configuration, when the energization control unit 23 controls the switch to be turned on and the detected value is lower than the expected value, it is possible to identify that a short circuit fault has occurred in the LED. In the above configuration, when the energization control unit 23 controls the switch to be turned off and the detected value is lower than the expected value, it is possible to identify that a short circuit fault has occurred in the switch.

Further, in the above configuration, a fault position can be identified in more detail by considering the following points. That is, in general, the forward voltage of the LED has a different voltage value for each emission color. The diagnostic voltage Vd has a voltage value corresponding to the forward voltage of the LED. Therefore, based on the difference between the detected value and the expected value, and the forward voltage of each LED, it is possible to identify which LED has an open circuit fault, or which LED has a short circuit fault.

After execution of step S104, the process proceeds to step S105. In step S105, a fault occurrence procedure is executed. The fault occurrence procedure is a procedure executed when a fault occurs in the light emitting unit 14. The fault occurrence procedure includes the notification procedure executed by the notification unit 26. That is, in the fault occurrence procedure, occurrence of a fault in the light emitting unit 14 is notified to the user by a method other than light emission by the light emitting unit 14, such as sound, command transmission, and emergency stop. After execution of step S105, this procedure ends.

[2] Second Diagnostic Method

A second diagnostic method is a method capable of diagnosing a fault in the light emitting unit 14 when the robot 2 is in the second, fourth, or fifth operating state. Further, the second diagnostic method is a method of diagnosing a fault in the light emitting unit 14 after slightly changing the control of energization of the LEDs 15 to 17 by the light emitting unit 14 from the normal time.

Specifically, in this case, in a period during which the operating state of the robot 2 is such that only one of the LEDs in the light emitting unit 14 is energized, the energization control unit 23 performs energization of one of the remaining LEDs for a predetermined diagnosis period. This diagnosis period is a relatively short period such as several to several hundred msec. That is, in this case, as shown in FIG. 4, the energization control unit 23 outputs a pulsed command signal so that one of the remaining LEDs is at a high level only during a diagnosis period Ta.

FIG. 4 shows a signal in each unit when the robot 2 is in the second state (the second operating state). Accordingly, in FIG. 4, the command signal Sg corresponding to the LED 16 and the command signal Sb corresponding to the LED 17 are pulsed signals that are at high level only during the diagnosis period Ta. In FIG. 4, for the command signals Sr, Sg, and Sb, a high level is represented as "H," and a low level is represented as "L."

When energizing one of the remaining LED, the energization control unit 23 controls energization so that the energized LED has a brightness lower than that in a steady state. The energization control unit 23 can control the brightness of the LED by using a PWM signal for the command signal as described above and controlling the duty thereof. In this case, the fault detection unit 25 detects a fault in the light emitting unit 14 based on the detected value of the diagnostic voltage Vd during the diagnosis period Ta.

The fault diagnosis device 20 (practically the CPU 21A) described herein is configured to repeatedly perform a procedure shown in FIG. 5 at a predetermined cycle. First, in step S201, it is determined whether or not only one of the LEDs 15 to 17 is energized (second state, fourth state, or fifth state). When two or more of the LEDs 15 to 17 are energized (first state or third state), "No" is determined in step S201, and this procedure ends. That is, in the second diagnostic method, a fault diagnosis of the light emitting unit 14 is not performed when the robot 2 is in the first state or the third state.

On the other hand, when only one of the LEDs 15 to 17 is energized (second state, fourth state, or fifth state), "YES" is determined in step S201, and the process proceeds to step S202. In the following description, each procedure is described by using an example of the state in which only the LED 15 is energized (second state). However, the same procedure applies to the state in which only the LED 16 or the LED 17 is energized (fourth state or fifth state).

In step S202, the diagnostic voltage Vd is detected, and the detected value is obtained as a first detected value Vd1. Subsequently, in step S203, the LED 17, which is one of two LEDs 16 and 17 that have not been energized, is energized. The energization period of the LED 17 in step S203 is the diagnosis period Ta described above. In step S204, the diagnostic voltage Vd, which is a voltage in the diagnosis period Ta during which the LED 17 is energized, is detected, and the detected value is obtained as a second detected value Vd2.

When an open circuit fault associated with the LED 17 has not occurred, the diagnostic voltage Vd in the diagnosis period Ta becomes lower than the diagnostic voltage Vd in the other periods as indicated by the solid line in FIG. 4. On the other hand, when an open circuit fault associated with the LED 17 has occurred, the diagnostic voltage Vd in the diagnosis period Ta becomes approximately the same as the diagnostic voltage Vd in the other periods as indicated by the dotted line in FIG. 4. In step S205, it is determined whether or not the second detected value Vd2 is lower than the first detected value Vd1. When the second detected value Vd2 is not lower than the first detected value Vd1, that is, when the second detected value Vd2 is approximately the same as the first detected value Vd1, "NO" is determined in step S205, and the process proceeds to step S206.

In step S206, a fault position is identified. In this case, since the second detected value Vd2 is approximately the same as the first detected value Vd1, it is possible to identify that an open circuit fault associated with the LED 17 has occurred. After execution of step S206, the process proceeds to step S207. In step S207, the fault occurrence procedure which is the same as one described in step S105 of the aforementioned first diagnostic method is executed. After execution of step S207, this procedure ends.

On the other hand, when the second detected value Vd2 is lower than the first detected value Vd1, "YES" is determined in step S205, and the process proceeds to step S208. In step S208, the LED 16, which is the other of two LEDs 16 and 17 that have not been energized, is energized. The energization period of the LED 16 in step S208 is the diagnosis period Ta described above. In step S209, the diagnostic voltage Vd, which is a voltage in the diagnosis period Ta during which the LED 16 is energized, is detected, and the detected value is obtained as a third detected value Vd3.

When an open circuit fault associated with the LED 16 has not occurred, the diagnostic voltage Vd in the diagnosis period Ta becomes lower than the diagnostic voltage Vd in the other periods as indicated by the solid line in FIG. 4. On the other hand, when an open circuit fault associated with the LED 16 has occurred, the diagnostic voltage Vd in the diagnosis period Ta becomes approximately the same as the diagnostic voltage Vd in the other periods as indicated by the dotted line in FIG. 4. In step S210, it is determined whether or not the third detected value Vd3 is lower than the first detected value Vd1. When the third detected value Vd3 is not lower than the first detected value Vd1, that is, when the third detected value Vd3 is approximately the same as the first detected value Vd1, "NO" is determined in step S210, and the process proceeds to step S206.

In this case, since the third detected value Vd3 is approximately the same as the first detected value Vd1, it is possible to identify that an open circuit fault associated with the LED 16 has occurred in step S206. On the other hand, when the third detected value Vd3 is lower than the first detected value Vd1, "YES" is determined in step S210, and this procedure ends. In this case, as a result of fault diagnosis by the fault diagnosis device 20, the result is obtained that a fault has not occurred in the light emitting unit 14.

[3] Third Diagnostic Method

A third diagnostic method is a method capable of diagnosing a fault in the light emitting unit 14 when the robot 3 is in the second, fourth, or fifth state (i.e., the second, fourth, or fifth operating state). Further, the third diagnostic method is a method of diagnosing a fault in the light emitting unit 14 after slightly changing the control of energization of the LEDs 15 to 17 by the light emitting unit 14 from the normal time.

Specifically, in this case, in a period during which the state of the robot 2 is such that only one of the LEDs in the light emitting unit 14 is energized, the energization control unit 23 performs energization of a plurality of the (two) remaining LEDs for a predetermined diagnosis period. This diagnosis period is a relatively short period as with the diagnosis period Ta in the second diagnostic method. When energizing the remaining LEDs, as in the second diagnostic method, the energization control unit 23 controls energization so that the energized LED has a brightness lower than that in a steady state. In this case, the fault detection unit 25 detects a fault in the light emitting unit 14 based on the detected value of the diagnostic voltage Vd during the diagnosis period.

The fault diagnosis device 20 (practically the CPU 21A) described herein is configured to repeatedly perform a procedure shown in FIG. 6 at a predetermined cycle. First, in step S301, it is determined whether or not only one of the LEDs 15 to 17 is energized (second state, fourth state, or fifth state). When two or more of the LEDs 15 to 17 are energized (first state or third state), "No" is determined in step S301, and this procedure ends. That is, in the third diagnostic method, a fault diagnosis of the light emitting unit 14 is not performed when the robot 3 is in the first state or the third state.

On the other hand, when only one of the LEDs 15 to 17 is energized (second state, fourth state, or fifth state), "YES" is determined in step S301, and the process proceeds to step S302. In the following description, each procedure is described by using an example of the state in which only the LED 15 is energized (second state). However, the same procedure applies to the state in which only the LED 16 or the LED 17 is energized (fourth state or fifth state).

In step S302, the diagnostic voltage Vd is detected, and the detected value is obtained as a first detected value Vd1. Subsequently, in step S303, two LEDs 16 and 17 that have not been energized are energized. The energization period of the LEDs 16 and 17 in step S303 is the diagnosis period described above. In step S304, the diagnostic voltage Vd, which is a voltage in the diagnosis period during which the LEDs 16 and 17 are energized, is detected, and the detected value is obtained as a second detected value Vd2.

When an open circuit fault associated with both the LEDs 16 and 17 has not occurred, the diagnostic voltage Vd in the diagnosis period becomes lower than the diagnostic voltage Vd in the other periods by a voltage due to energization of two LEDs. On the other hand, when an open circuit fault associated with one of the LEDs 16 and 17 has occurred, the diagnostic voltage Vd in the diagnosis period becomes lower than the diagnostic voltage Vd in the other periods by a voltage due to energization of one LED. Further, when an open circuit fault associated with both the LEDs 16 and 17 has occurred, the diagnostic voltage Vd in the diagnosis period becomes approximately the same as the diagnostic voltage Vd in the other periods.

Based on the above points, in step S305, it is determined whether or not the value obtained by subtracting the second detection value Vd2 from the first detection value Vd1 is equal to or greater than a threshold Vt2. The threshold Vt2 corresponds to the amount of decrease in the diagnostic voltage Vd due to energization of two LEDs. When the value obtained by subtracting the second detection value Vd2 from the first detection value Vd1 is equal to or greater than the threshold Vt2, "YES" is determined in step S305, and this procedure ends. In this case, as a result of fault diagnosis by the fault diagnosis device 20, the result is obtained that a fault has not occurred in the light emitting unit 14.

When the value obtained by subtracting the second detection value Vd2 from the first detection value Vd1 is less than the threshold Vt2, "NO" is determined in step S305, and the process proceeds to step S306. In step S306, it is determined whether or not the value obtained by subtracting the second detection value Vd2 from the first detection value Vd1 is equal to or greater than a threshold Vt1. The threshold Vt1 corresponds to the amount of decrease in the diagnostic voltage Vd due to energization of one LED. When the value obtained by subtracting the second detection value Vd2 from the first detection value Vd1 is less than the threshold Vt1, "NO" is determined in step S306, and the process proceeds to step S307.

In step S307, a fault position is identified. In this case, since the second detected value Vd2 seems to be approximately the same as the first detected value Vd1, it is possible to identify that an open circuit fault associated with the LEDs 16 and 17 has occurred. After execution of step S307, the process proceeds to step S308. When the value obtained by subtracting the second detection value Vd2 from the first detection value Vd1 is equal to or greater than the threshold Vt1, "YES" is determined in step S306, and the process proceeds to step S309.

In this case, while it is possible to identify that an open circuit fault corresponding to one of the LEDs 16 and 17 has occurred, it is not possible to identify whether the open circuit fault associated with the LED 16 or 17. Therefore, in step S309, a fault position identification procedure for identifying a fault position is executed. The specific details of the fault position identification procedure is as that shown in FIG. 7, for example.

First, in step S401, one of the remaining LEDs 16 and 17, which is for example the LED 16, is energized. The energization period of the LED 16 in step S401 is the diagnosis period described above. Subsequently, in step S402, the diagnostic voltage Vd, which is a voltage in the diagnosis period during which the LED 16 is energized, is detected, and the detected value is obtained as the third detected value Vd3.

When the open circuit fault that has occurred is one associated with the LED 17, an open circuit fault associated with the LED 16 has not occurred. Accordingly, the diagnostic voltage Vd in the diagnosis period becomes lower than the diagnostic voltage Vd in the other periods. On the other hand, when the open circuit fault that has occurred is one associated with the LED 16, the diagnostic voltage Vd in the diagnosis period becomes approximately the same as the diagnostic voltage Vd in the other periods.

In step S403, it is determined whether or not the third detected value Vd3 is lower than the first detected value Vd1. When the third detected value Vd3 is lower than the first detected value Vd1, "YES" is determined in step S403, and the process proceeds to step S404. In step S404, it is identified that an open circuit fault associated with the other of the remaining LEDs 16 and 17, which is the LED 17, has occurred.

On the other hand, when the third detected value Vd3 is not lower than the first detected value Vd1, that is, when the third detected value Vd3 is approximately the same as the first detected value Vd1, "NO" is determined in step S403, and the process proceeds to step S405. In step S405, it is identified that an open circuit fault associated with one of the remaining LEDs 16 and 17, which is the LED 16, has occurred. After execution of step S404 or S405, the fault position identification procedure ends, and the process proceeds to step S308. In step S308, the fault occurrence procedure which is the same as one described in step S105 of the aforementioned first diagnostic method is executed. After execution of step S308, this procedure ends.

As described above, according to the present embodiment, the following effects can be achieved. The robot system 1 of the present embodiment includes the fault diagnosis device 20 that diagnoses a fault in the light emitting unit 14. The fault diagnosis device 20 includes the energization control unit 23 that controls energization of the LEDs 15 to 17, and the voltage detection unit 24 that detects the diagnostic voltage Vd that varies depending on the terminal voltage of the LEDs 15 to 17, and the fault detection unit 25. The fault detection unit 25 detects a fault in the light emitting unit 14 based on the control state of energization by the energization control unit 23 and the detected value of the diagnostic voltage Vd by the voltage detection unit 24.

Specifically, the fault detection unit 25 diagnoses a fault in the light emitting unit 14 based on whether the expected value of the diagnostic voltage Vd corresponding to the energization state of the LEDs 15 to 17 that can be estimated from the control state of energization at that time matches the detected value of the diagnostic voltage Vd. According to this configuration, a fault in the light emitting unit 14 can be accurately detected. Further, the fault detection unit 25 is configured to detect a fault position taking into account the difference in forward voltage of the LEDs 15 to 17 having different emission colors. Accordingly, it is possible to identify which of the LEDs 15 to 17 and the components for driving the LEDs 15 to 17 has a fault.

In the robot system 1 having the above configuration, a method can be adopted for diagnosing a fault in the light emitting unit 14, which is performed by energizing (lighting) one of the LEDs in the state in which all the LEDs have been deenergized (not lighted). In this method, however, the light emitting unit 14, which has not emitted light, suddenly emits light of a color that does not correspond to the operating state of the robot 2. In this case, since the light emitting unit 14 makes a transition from a non-light emission state to a light emission state, such a change is immediately noticeable for the operator (user). As a consequence, the operator, who notices that the light emitting unit 14 has suddenly emitted light at a timing that he or she did not expect, may feel uneasy.

In the first diagnostic method of the present embodiment, a fault in the light emitting unit 14 is diagnosed without changing the control of energization of the LEDs 15 to 17 by the light emitting unit 14 from the normal time. According to the first diagnostic method, since the operation of the light emitting unit 14 is the same as that in the normal time, a diagnosis of the light emitting unit 14 can be performed without making the operator feel uneasy.

Further, in the second diagnostic method of the present embodiment, in a period during which the operating state of the robot 2 is such that only one of the LEDs in the light emitting unit 14 is energized, the energization control unit 23 performs energization of one of the remaining LEDs for the predetermined diagnosis period Ta. Further, in the third diagnostic method of the present embodiment, in a period during which the state of the robot 2 is such that only one of the LEDs in the light emitting unit 14 is energized, the energization control unit 23 performs energization of the remaining two LEDs for the predetermined diagnosis period Ta. In the second and third diagnostic methods, the fault detection unit 25 detects a fault in the light emitting unit 14 based on the detected value of the diagnostic voltage Vd during the diagnosis period Ta.

According to the second and third diagnostic methods described above, the light emitting unit 14 does not make a sudden transition from a non-light emission state to a light emission state. In this case, the color of light emitted from the light emitting unit 14 changes from a color of light emitted from one LED that has been initially energized to a mixed color obtained by mixing the color of light initially emitted with a color of light emitted from one or more of the remaining LEDs. Such a change is less noticeable for the operator. Therefore, according to the second and third diagnostic methods as well, a diagnosis of the light emitting unit 14 can be performed without making the operator feel uneasy.

The first to third diagnostic methods each have the advantage. First, the first diagnostic method has an advantage that the light emitting unit 14 can be diagnosed without changing the light emission state of the light emitting unit 14 from the normal time since it is not required to change the control of energization of the LEDs 15 to 17 from the normal time. However, in the first diagnostic method, when a difference in forward voltage of three LEDs 15 to 17 is small, it may be difficult to identify the fault position.

On the other hand, in the second and third diagnostic methods, one or more LEDs different from the initially energized LED are energized. Then, based on whether or not the diagnostic voltage Vd in the diagnosis period Ta during which the one or more LEDs are energized is lower than the diagnostic voltage Vd in other periods, it is possible to detect whether or not a fault associated with the one or more LEDs has occurred. Therefore, according to the second and third diagnostic methods, there is an advantage that the fault position can be identified even when a difference in forward voltage of three LEDs 15 to 17 is small.

Further, in the second and third diagnostic methods, the energization control unit 23 controls energization so that the energized LED has a brightness lower than that in a steady state. Accordingly, it is possible to reduce the degree of change in color, when changing from the color of light emitted from one LED that has been initially energized to a mixed color. Such a change is further less noticeable for the operator. Therefore, according to the second and third diagnostic methods, a diagnosis of the light emitting unit 14 can be performed while further reducing the possibility of causing concern to the operator.

The second diagnostic method and the third diagnostic method can be performed independently or in combination. For example, the diagnostic methods may be combined, in which a fault in the light emitting unit 14 can be first detected by the third diagnostic method, and, when the diagnosis result indicates that there is a possibility that a fault has occurred in the light emitting unit 14, a fault in the light emitting unit 14 can be then detected by the second diagnostic method. Alternatively, the diagnostic methods may be combined, in which a fault in the light emitting unit 14 can be first detected by the second diagnostic method, and, when the diagnosis result indicates that there is a possibility that a fault has occurred in the light emitting unit 14, a fault in the light emitting unit 14 can be then detected by the third diagnostic method. In this manner, it is possible to detect a fault such as one in which the LEDs 15 to 17, which can be lighted one by one, cannot be lighted at the same time due to occurrence of overcurrent or the like.

In the fault diagnosis device 20 of the present embodiment, the energization control unit 23 is configured so as to secure the safety necessary for the user who uses the robot 2 during energization of the LEDs 15 to 17 regardless of the operating state of the robot 2. With this configuration, even when the energization control unit 23 performs energization of the LEDs 15 to 17 for a fault diagnosis of the light emitting unit 14 in a manner different from the normal operation, it is possible to eliminate a concern that the safety of the user lowers.

In the fault diagnosis device 20 of the present embodiment, each emission color of the LEDs 15 to 17 is a color that is not likely to cause the user who uses the robot 2 to erroneously recognize an operating state of the robot 2 during energization of the LEDs 15 to 17 by the energization control unit 23 regardless of the operating state of the robot 2. With this configuration, even when the energization control unit 23 performs energization of the LEDs 15 to 17 for a fault diagnosis of the light emitting unit 14 in a manner different from the normal operation, the user does not erroneously recognize the operating state of the robot 2 based on the color of light emitted from the light emitting unit 14, and thus does not carelessly approach the robot 2. Accordingly, a concern that the safety of the user lowers can be eliminated.

More specifically, in the fault diagnosis device 20 of the present embodiment, the light emitting unit 14 including the R-LED 15, G-LED 16, and B-LED 17, which are three LEDs corresponding to three primary colors of light, is a target of diagnosis. When the LEDs 15 to 17 are energized as described above, the light emitting unit 14 emits light of a color according to the operating state of the robot 2. As the light emitting unit 14 is a target of fault diagnosis, the following effects can be obtained.

That is, the operating state of the robot 2 in which only one LED is energized corresponds to the second state, the fourth state, and the fifth state. With this configuration, even when one of the remaining LEDs is energized for a fault diagnosis in the above state, that is, even when the second diagnostic method is performed to diagnose the light emitting unit 14, it does not cause a problem of impairing the safety of the operator. The reason for this will be described below.

First, when the B-LED 17 is energized in the second state of the robot 2, the color of light emitted from the light emitting unit 14 becomes magenta, which is a mixed color of red and blue, and does not become a color indicative of another state of the robot 2. Accordingly, the operator does not erroneously recognize the state of the robot 2, and thus does not carelessly approach the robot 2. This prevents occurrence of a problem in safety. Further, when the G-LED 16 is energized in the second state of the robot 2, the color of light emitted from the light emitting unit 14 becomes yellow, which is a mixed color of red and green. In this case, yellow is a color corresponding to the third state, which indicates that the robot 2 is in an error state, as with red, which is the color initially emitted. Therefore, even when the operator notices that the color of emitted light changes from red to yellow, the operator still recognizes that the robot 2 is in an error state, and thus does not carelessly approach the robot 2. A concern that the safety of the user lowers can be eliminated.

When the R-LED 15 is energized in the fourth state of the robot 2, the color of light emitted from the light emitting unit 14 becomes yellow, which is a mixed color of green and red. As described above, yellow is a color indicating that the robot 2 is in an error state. Therefore, even when the operator notices that the color of emitted light changes from green to yellow, the operator recognizes that the operating state of the robot 2 has changed from initialization to an error state, and thus does not carelessly approach the robot 2. This prevents occurrence of a problem in safety. Further, when the B-LED 17 is energized in the fourth state of the robot 2, the color of light emitted from the light emitting unit 14 becomes cyan, which is a mixed color of green and blue, and does not become a color indicative of another state of the robot 2. Accordingly, the operator does not erroneously recognize the operating state of the robot 2, and thus does not carelessly approach the robot 2. A concern that the safety of the user lowers can be eliminated.

When the R-LED 15 is energized in the fifth state of the robot 2, the color of light emitted from the light emitting unit 14 becomes magenta, which is a mixed color of blue and red, and does not become a color indicative of another state of the robot 5. Accordingly, the operator does not erroneously recognize the operating state of the robot 2, and thus does not carelessly approach the robot 2. This prevents occurrence of a problem in safety. Further, when the G-LED 16 is energized in the fifth state of the robot 2, the color of light emitted from the light emitting unit 14 becomes cyan, which is a mixed color of blue and green, and does not become a color indicative of another operating state of the robot 2.

Accordingly, the operator does not erroneously recognize the operating state of the robot 2, and thus does not carelessly approach the robot 2. This prevents occurrence of a problem in safety.

Further, with this configuration, even when remaining two LEDs are energized for a fault diagnosis in the state in which only one LED is energized (second state, fourth state, and fifth state), that is, even when the third diagnostic method is performed to diagnose the light emitting unit 14, it does not cause a problem of impairing the safety of the operator. In addition, with this configuration, even when remaining one light emitting diode is energized for a fault diagnosis in the state in which two LEDs are energized (third state), a concern that the safety of the user lowers can be eliminated. The reason for this will be described below.

That is, in all the above cases, the color of light emitted from the light emitting unit 14 becomes white. In the present embodiment, white is a color indicating that the robot 2 is in the first state, in which the robot 2 automatically performs a predetermined operation. Therefore, even when the operator notices that the color of light emitted from the light emitting unit 14 changes from the initial color to white, the operator recognizes that the operating state of the robot 2 has changed from the state indicated by the initial color to the first state, and thus does not carelessly approach the robot 2. Thus a concern that the safety of the user lowers can be eliminated.

As described above, according to the above configuration, when the robot 2 is in the state in which the operator may have a problem in safety when erroneously approaching the robot 2 (particularly, in the first state), it is possible to prevent the operator from carelessly approaching the robot 2 by erroneously recognizing that the robot 2 is in the state in which the operator can safely approach the robot 2 (particularly, in the fifth state) based on the emission color of the light emitting unit 14.

According to the second diagnostic method of the present embodiment, the following effects can also be achieved. First, by performing diagnosis in the second state in which only the R-LED 15 is energized, the following effects can be obtained. That is, the second state is a state in which an error with a relatively high degree of importance has occurred, so the operator does not carelessly approach the robot 2. Accordingly, even if the emission color momentarily changes due to other LED being lighted for a short period of time during the second state, there is a very low possibility of the operator approaching the robot 2. Therefore, by performing diagnosis in the second state, a diagnosis of the light emitting unit 14 can be performed while successfully maintaining the safety.

Further, by performing diagnosis in the fourth state in which only the G-LED 16 is energized, the following effects can be obtained. That is, the fourth state is an initialization state of the robot 2, so a fault diagnosis of the light emitting unit 14 can be performed during initialization. Accordingly, by performing diagnosis in the fourth state, it is possible to prevent the robot 2 from making a transition to the normal operation state while a fault has occurred in the light emitting unit 14. As a result, the safety is improved.

Further, by performing diagnosis in the fifth state in which only the B-LED 17 is energized, the following effects can be obtained. That is, the fifth state is a state in which the robot 2 is in the direct teaching mode. Usually, the direct teaching takes a relatively long time. Accordingly, by performing diagnosis in the fifth state, it is possible to ensure a relatively long time for fault diagnosis of the light emitting unit 14, which enables early detection of a fault in the light emitting unit 14. As a result, the safety is improved.

In the second diagnostic method, an interval between the diagnosis period in which energization is performed for the LED 17, which is one of the LEDs 16 and 17 that have not been energized, and the diagnosis period in which energization is performed for the LED 16, which is the other of the LEDs 16 and 17, in other words, an interval between energization of the LED 17 and energization of the LED 16, can be set based on the following concepts. That is, if the interval is set such that energization of the LED 16 is performed when a relatively short time has elapsed after energization of the LED 17, the operator, who has noticed the first change in emission color due to energization of the LED 17, is likely to be cautious about a change in emission color when the second change in emission color due to energization of the LED 16 occurs. As a consequence, the operator may clearly notice the second change in emission color.

The interval is preferably set so that energization of the LED 16 is performed immediately after energization of the LED 17 is performed. With this setting, since the emission color of the light emitting unit 14 continuously changes, the change in emission color is less noticeable for the operator. Furthermore, whether the emission color has changed or not is less noticeable for the operator. Alternatively, the interval may be set so that energization of the LED 16 is performed when a relatively long time has elapsed after energization of the LED 17 is performed.

With this setting, when a relatively long time has elapsed after the change in emission color due to energization of the LED 17, the emission color again changes due to energization of the LED 16. Accordingly, even if the operator notices the first change in emission color to some extent, the operator becomes less cautious about a change in emission color due to the lapse of a relatively long time, and does not overreact to a change in emission color. Thus, the second change in emission color is less noticeable for the operator.

The fault diagnosis device 20 includes the notification unit 26 that performs a notification procedure for notifying the operator (user) of occurrence of a fault in the light emitting unit 14 by a method other than lighting of the LEDs 15 to 17 when the result of the fault diagnosis indicates that a fault has occurred in the light emitting unit 14. When a fault in the light emitting unit 14 is detected, there is a high possibility that normal lighting of the LEDs 15 to 17 cannot be performed. Accordingly, occurrence of a fault in the light emitting unit 14 may not be reliably notified by lighting of the LEDs 15 to 17. According to the above configuration, since occurrence of a fault in the light emitting unit 14 is notified by a method other than lighting of the LEDs 15 to 17, notification can be reliably performed.

In the present embodiment, as a specific method of notification, emergency stop of the robot 2 can be performed by shutting off power supply to the robot 2. Accordingly, even if the operator erroneously recognizes the emission color of the light emitting unit 14 due to occurrence of a fault in the light emitting unit 14, it does not impair the safety of the operator due to erroneous recognition since the operation of the robot 2 is forcibly stopped.

In the configuration of the present embodiment, the resistor 22 for generating the diagnostic voltage Vd that varies depending on the terminal voltage of the LEDs 15 to 17 is provided in the controller 3, and the voltage detection unit 24 is configured to detect the terminal voltage of the resistor 22 as the diagnostic voltage Vd. The resistor 22 can also be modified to be provided in the robot 2, instead of the controller 3. However, the configuration of the present embodiment has an advantage described below over the configuration of the modified example.

In the configuration of the modified example, the number of cables 18 (number of wiring lines) connecting the controller 3 and the robot 2 increases. That is, while the configuration of the present embodiment requires only the wiring (power supply line L1) for supplying the power supply voltage Va to the light emitting unit 14, the configuration of the modified example requires additional wiring for supplying the diagnostic voltage Vd from the robot 2 to the controller 3. In other words, according to the configuration of the present embodiment, the number of cables 18 can be reduced by one compared with the configuration of the modified example.

In the configuration of the modified example, since the voltage detection unit 24 provided in the controller 3 detects the terminal voltage of the resistor 22 provided in the robot 2 via the cable 18, the detection accuracy of the diagnostic voltage Vd may be reduced due to the influence of noise in the wiring, voltage drop in the wiring, or the like. On the other hand, in the configuration of the present embodiment, since the voltage detection unit 24 provided in the controller 3 detects the terminal voltage of the resistor 22 provided in the same controller 3 as the diagnostic voltage Vd, the detection accuracy of the diagnostic voltage Vd will not be reduced due to the influence of noise in the wiring, voltage drop in the wiring, or the like. Accordingly, the detection accuracy of the diagnostic voltage Vd can be improved compared with the configuration of the modified example.

Second Embodiment

With reference to FIG. 8, a second embodiment in which the configuration of the light emitting unit is modified from the first embodiment will be described. As shown in FIG. 8, a light emitting unit 31 of the second embodiment differs from the light emitting unit 14 of the first embodiment in that it includes four R-LEDs 15, G-LEDs 16, and B-LEDs 17.

In the second embodiment, components or elements which are same or identical as or to those in the first embodiment are given the same reference numbers for avoiding redundant explanations thereof.

In this case, a second terminal of the switch SWr is connected to the ground line L2 via the resistor Rr and each of the four R-LEDs 15. Further, in this case, a second terminal of the switch Swg is connected to the ground line L2 via the resistor Rg and each of the four G-LEDs 16. Further, in this case, a second terminal of the switch Swb is connected to the ground line L2 via the resistor Rb and each of the four B-LEDs 17.

According to the above configuration, energization of the four R-LEDs 15 is controlled by the command signal Sr, energization of the four G-LEDs 16 is controlled by the command signal Sg, and energization of the four B-LEDs 17 is controlled by the command signal Sb. Therefore, in the above configuration, the switch SWr is turned on to energize and light the four R-LEDs 15, the switch SWg is turned on to energize and light the four G-LEDs 16, and the switch SWb is turned on to energize and light the four B-LEDs 17.

For the light emitting unit 31 having the configuration of the present embodiment described above, a fault diagnosis can also be performed by using the fault diagnosis device 20 in the same manner as that described in the first embodiment. In this case, however, it is not possible to identify the fault position as to which of the four R-LEDs 15 has a fault. In other words, it is possible to identify that a fault has occurred in any one of the four R-LEDs 15. The same applies to the G-LEDs 16 and the B-LEDs 17.

Other Embodiments

The present invention is not limited to the embodiments described above and shown in the drawings. Various modifications, combinations, or extensions can be made without departing from the spirit of the present invention. Numerical values and the like shown in the above embodiments are merely examples, and should not be construed to limit the present invention.

The fault diagnosis device for a robot according to the present invention should not be limited to being used for the robot system 1, which is a common industrial robot system, but also can be applied to robot systems in general having a light emitting unit that emits light of a color according to the state of the robot by individually energizing and lighting a plurality of types of LEDs of different emission colors.

In the above embodiments, the resistor 22 for generating the diagnostic voltage Vd is provided upstream in the energization path connected to the LEDs 15 to 17 (in the power supply line L3), and the voltage detection unit 24 is configured to detect the downstream terminal voltage of the resistor 22 as the diagnostic voltage Vd. However, the resistor 22 may also be provided downstream in the energization path connected to the LEDs 15 to 17 (in the ground line L2). In this case, the voltage detection unit 24 detects the upstream terminal voltage of the resistor 22, which is provided downstream in the energization path, as the diagnostic voltage Vd.

PARTIAL REFERENCE SINGS LIST

1 . . . robot system; 2 . . . robot (industrial robot); 14, 31 . . . light emitting unit; 15 . . . red light emitting diode; 16 . . . green light emitting diode; 17 . . . blue light emitting diode; 20 . . . fault diagnosis device; 23 . . . energization control unit; 24 . . . voltage detection unit; 25 . . . fault detection unit; 26 . . . notification unit

What is claimed is:
1. A fault diagnosis device provided in an industrial robot, comprising:
a light emitting unit provided in the robot, the light emitting unit including (i) a plurality of types of light emitting diodes that emit different emission colors when the light emitting diodes are individually energized, and (ii) a plurality of switches that selectively switch on and off energization of the light emitting diodes, the different emission colors showing a robot state of the robot including operating states of the robot and a fault caused in the light emitting unit;
an energization control unit configured to selectively control on and off states of the switches so that the energization of the light emitting diodes are selectively controlled;
a voltage detection unit configured to detect, as a diagnostic voltage, a unique terminal voltage of the light emitting diodes when the energization control unit controls the switches, the unique terminal voltage being different depending on whether the robot is in the operating states or whether the fault is caused in the light emitting unit; and
a fault detection unit configured to detect the fault caused in the light emitting unit based on a state of the energization controlled by the energization control unit and a value of the diagnostic voltage detected by the voltage detection unit.

2. The fault diagnosis device according to claim 1, wherein, when the operating state of the robot shows an operating state in which only one of the light emitting diodes in the light emitting unit is energized, the energization control unit is configured to energize one of remaining light emitting diodes other than the one of the light emitting diodes, and the fault detection unit is configured to detect the fault in the light emitting unit based on the state of the energization controlled by the energization control unit and the value of the diagnostic voltage detected in a period during which the energization control unit energizes the one of the remaining light emitting diodes.

3. The fault diagnosis device according to claim 1, wherein, when the operating state of the robot shows an operating state in which only one of the light emitting diodes in the light emitting unit is energized, the energization control unit is configured to energize a plurality of light emitting diodes among remaining light emitting diodes other than the one of the light emitting diodes, and the fault detection unit is configured to detect the fault in the light emitting unit based on the state of the energization controlled by the energization control unit and the value of the diagnostic voltage detected in a period during which the energization control unit energizes the plurality of the light emitting diodes among the remaining light emitting diodes.

4. The fault diagnosis device according to claim 3, wherein, when energizing the plurality of light emitting diodes among the remaining light emitting diodes, the energization control unit is configured to control the energization so that the plurality of light emitting diodes among the remaining light emitting diodes have a brightness lower than that in a steady state thereof.

5. The fault diagnosis device according to claim 1, further comprising a notification unit configured to notify occurrence of the fault in the light emitting unit based on a method different from lighting of the light emitting diodes in the controlled state of the energization, when the fault in the light emitting unit is detected by the fault detection unit.

6. The fault diagnosis device according to claim 1, wherein the energization control unit is configured so as not to impair safety of a user who uses the robot during the energization of the light emitting diodes regardless of the operating state of the robot.

7. The fault diagnosis device according to claim 1, wherein each emission color of the plurality of types of light emitting diodes is a color that is not likely to cause a user who uses the robot to erroneously recognize an operating state of the robot during the energization of the light emitting diodes by the energization control unit regardless of the operating state of the robot.

8. The fault diagnosis device according to claim 1, wherein the light emitting diodes of the light emitting unit include a red light emitting diode, a green light emitting diode, and a blue light emitting diode, which are three light emitting diodes corresponding to three primary colors of light, the light emitting unit is configured to emit white light due to the red light emitting diode, the green light emitting diode, and the blue light emitting diode being energized when the state of the robot is a first state, in which a predetermined operation is automatically performed, the light emitting unit is configured to emit red light due to the red light emitting diode being energized when the state of the robot is a second state, in which an error with a relatively high degree of importance has occurred, the light emitting unit is configured to emit yellow light due to the red light emitting diode and the green light emitting diode being energized when the state of the robot is a third state, in which an error with a relatively low degree of importance has occurred, the light emitting unit is configured to emit green light due to the green light emitting diode being energized when the state of the robot is a fourth state, which is an initialization state, and the light emitting unit is configured to emit blue light due to the blue light emitting diode being energized when the state of the robot is a fifth state, which is a direct teaching mode in which a user who uses the robot performs teaching by manually moving the robot.

9. The fault diagnosis device according to claim 2, further comprising a notification unit configured to notify occurrence of the fault in the light emitting unit based on a method different from lighting of the light emitting diodes in the controlled state of the energization, when the fault in the light emitting unit is detected by the fault detection unit.

10. The fault diagnosis device according to claim 3, further comprising a notification unit configured to notify occurrence of the fault in the light emitting unit based on a method different from lighting of the light emitting diodes in the controlled state of the energization, when the fault in the light emitting unit is detected by the fault detection unit.

11. The fault diagnosis device according to claim 2, wherein the light emitting diodes of the light emitting unit include a red light emitting diode, a green light emitting diode, and a blue light emitting diode, which are three light emitting diodes corresponding to three primary colors of light, the light emitting unit is configured to emit white light due to the red light emitting diode, the green light emitting diode, and the blue light emitting diode being energized when the state of the robot is a first state, in which a predetermined operation is automatically performed, the light emitting unit is configured to emit red light due to the red light emitting diode being energized when the state of the robot is a second state, in which an error with a relatively high degree of importance has occurred, the light emitting unit is configured to emit yellow light due to the red light emitting diode and the green light emitting diode being energized when the state of the robot is a third state, in which an error with a relatively low degree of importance has occurred, the light emitting unit is configured to emit green light due to the green light emitting diode being energized when the state of the robot is a fourth state, which is an initialization state, and the light emitting unit is configured to emit blue light due to the blue light emitting diode being energized when the state of the robot is a fifth state, which is a direct teaching mode in which a user who uses the robot performs teaching by manually moving the robot.

12. The fault diagnosis device according to claim 3, wherein the light emitting diodes of the light emitting unit include a red light emitting diode, a green light emitting diode, and a blue light emitting diode, which are three light emitting diodes corresponding to three primary colors of light, the light emitting unit is configured to emit white light due to the red light emitting diode, the green light emitting diode, and the blue light emitting diode being energized when the state of the robot is a first state, in which a predetermined operation is automatically performed, the light emitting unit is configured to emit red light due to the red light emitting diode being energized when the state of the robot is a second state, in which an error with a relatively high degree of importance has occurred, the light emitting unit is configured to emit yellow light due to the red light emitting diode and the green light emitting diode being energized when the state of the robot is a third state, in which an error with a relatively low degree of importance has occurred, the light emitting unit is configured to emit green light due to the green light emitting diode being energized when the state of the robot is a fourth state, which is an initialization state, and the light emitting unit is configured to emit blue light due to the blue light emitting diode being energized when the state of the robot is a fifth state, which is a direct teaching mode in which a user who uses the robot performs teaching by manually moving the robot.

13. The fault diagnosis device according to claim 4, wherein the light emitting diodes of the light emitting unit include a red light emitting diode, a green light emitting diode, and a blue light emitting diode, which are three light emitting diodes corresponding to three primary colors of light, the light emitting unit is configured to emit white light due to the red light emitting diode, the green light emitting diode, and the blue light emitting diode being energized when the state of the robot is a first state, in which a predetermined operation is automatically performed, the light emitting unit is configured to emit red light due to the red light emitting diode being energized when the state of the robot is a second state, in which an error with a relatively high degree of importance has occurred, the light emitting unit is configured to emit yellow light due to the red light emitting diode and the green light emitting diode being energized when the state of the robot is a third state, in which an error with a relatively low degree of importance has occurred, the light emitting unit is configured to emit green light due to the green light emitting diode being energized when the state of the robot is a fourth state, which is an initialization state, and the light emitting unit is configured to emit blue light due to the blue light emitting diode being energized when the state of the robot is a fifth state, which is a direct teaching mode in which a user who uses the robot performs teaching by manually moving the robot.

14. A robot system, comprising:

an industrial robot;

a light emitting unit installed in the robot, the light emitting unit including (i) a plurality of types of light emitting diodes that emit different emission colors when the light emitting diodes are individually energized, and (ii) a plurality of switches that selectively switch on and off energization of the light emitting diodes, the different emission colors showing a robot state of the robot including operating states of the robot and a fault caused in the light emitting unit;

an energization control unit configured to selectively control on and off states of the switches so that the energization of the light emitting diodes are selectively controlled;

a voltage detection unit configured to detect, as a diagnostic voltage, a unique terminal voltage of the light emitting diodes when the energization control unit controls the switches, the unique terminal voltage being different depending on whether the robot is in the operating states or whether the fault is caused in the light emitting unit; and a fault detection unit configured to detect the fault caused in the light emitting unit based on a state of the energization controlled by the energization control unit and a value of the diagnostic voltage detected by the voltage detection unit.

15. The robot system according to claim 14, wherein, when the operating state of the robot shows an operating state in which only one of the light emitting diodes in the light emitting unit is energized, the energization control unit is configured to energize one of remaining light emitting diodes other than the one of the light emitting diodes, and the fault detection unit is configured to detect the fault in the light emitting unit based on the state of the energization controlled by the energization control unit and the value of the diagnostic voltage detected in a period during which the energization control unit energizes the one of remaining light emitting diodes.

16. The robot system according to claim 15, wherein the light emitting diodes of the light emitting unit include a red light emitting diode, a green light emitting diode, and a blue light emitting diode, which are three light emitting diodes corresponding to three primary colors of light, the light emitting unit is configured to emit white light due to the red light emitting diode, the green light emitting diode, and the blue light emitting diode being energized when the state of the robot is a first state, in which a predetermined operation is automatically performed, the light emitting unit is configured to emit red light due to the red light emitting diode being energized when the state of the robot is a second state, in which an error with a relatively high degree of importance has occurred, the light emitting unit is configured to emit yellow light due to the red light emitting diode and the green light emitting diode being energized when the state of the robot is a third state, in which an error with a relatively low degree of importance has occurred, the light emitting unit is configured to emit green light due to the green light emitting diode being energized when the state of the robot is a fourth state, which is an initialization state, and the light emitting unit is configured to emit blue light due to the blue light emitting diode being energized when the state of the robot is a fifth state, which is a direct teaching mode in which a user who uses the robot performs teaching by manually moving the robot.

* * * * *